(12) United States Patent
Kim et al.

(10) Patent No.: US 11,302,774 B2
(45) Date of Patent: Apr. 12, 2022

(54) SEMICONDUCTOR DEVICE AND METHOD FABRICATING THE SAME

(71) Applicant: XIA TAI XIN SEMICONDUCTOR (QING DAO) LTD., Qingdao (CN)

(72) Inventors: Hyunyoung Kim, Singapore (SG); Dowon Kwak, Singapore (SG); Kang-Won Seo, Singapore (SG)

(73) Assignee: XIA TAI XIN SEMICONDUCTOR (QING DAO) LTD., Qingdao (CN)

( * ) Notice: Subject to any disclaimer, the term of this patent is extended or adjusted under 35 U.S.C. 154(b) by 0 days.

(21) Appl. No.: 16/687,527

(22) Filed: Nov. 18, 2019

(65) Prior Publication Data
US 2021/0151553 A1 May 20, 2021

(51) Int. Cl.
| | | |
|---|---|---|
| *H01L 27/108* | (2006.01) | |
| *H01L 27/105* | (2006.01) | |
| *H01L 21/67* | (2006.01) | |
| *H01L 21/285* | (2006.01) | |
| *H01L 21/768* | (2006.01) | |
| *H01L 21/311* | (2006.01) | |
| *H01L 21/3105* | (2006.01) | |
| *H01L 49/02* | (2006.01) | |

(52) U.S. Cl.
CPC ........ *H01L 28/91* (2013.01); *H01L 27/10814* (2013.01); *H01L 27/10852* (2013.01); *H01L 21/28556* (2013.01); *H01L 21/31053* (2013.01); *H01L 21/67069* (2013.01); *H01L 21/76829* (2013.01); *H01L 27/108* (2013.01); *H01L 27/1052* (2013.01)

(58) Field of Classification Search
CPC ......... H01L 27/10808; H01L 27/10814; H01L 27/1085; H01L 27/10852; H01L 28/90; H01L 28/91
See application file for complete search history.

(56) References Cited

U.S. PATENT DOCUMENTS

| | | | | |
|---|---|---|---|---|
| 9,437,420 | B2* | 9/2016 | Cho | ................. H01L 27/10894 |
| 2002/0167037 | A1* | 11/2002 | Lee | .................. H01L 27/10852 257/301 |
| 2004/0056295 | A1* | 3/2004 | Agarwal | ................. H01L 28/91 257/296 |
| 2006/0014385 | A1* | 1/2006 | Kim | .................. C23C 16/45529 438/680 |
| 2006/0099760 | A1* | 5/2006 | Kim | ........................ H01L 28/75 438/250 |
| 2009/0309187 | A1* | 12/2009 | Choi | ....................... H01L 28/40 257/532 |
| 2016/0014385 | A1* | 1/2016 | Sano | .................... H04N 9/3194 348/571 |

* cited by examiner

*Primary Examiner* — David C Spalla
(74) *Attorney, Agent, or Firm* — ScienBiziP, P.C.

(57) ABSTRACT

A semiconductor device is provided. The semiconductor device includes a substrate, a conductive pattern, a first conductive layer, and a dielectric layer. The conductive pattern extends upwardly from the substrate. The conductive pattern has a hollow structure. The first conductive layer covers the conductive pattern. The dielectric layer at least covers the first conductive layer.

16 Claims, 6 Drawing Sheets

SEMICONDUCTOR DEVICE AND METHOD FABRICATING THE SAME

FIELD

The present disclosure relates to semiconductor fabrication and more specifically to a capacitor having a lower electrode with a multiple-layers structure and the fabricating method thereof.

BACKGROUND

As the size of memory device become smaller, the memory capacitance is restricted due to the structure of the capacitor. In a metal-insulator-metal (MIM) structure, the limited effective area of the lower electrode leads to low performance of memory device.

SUMMARY

The following presents a summary of examples of the present disclosure in order to provide a basic understanding of at least some of its examples. This summary is not an extensive overview of the present disclosure. It is not intended to identify key or critical elements of the present disclosure or to delineate the scope of the present disclosure. The following summary merely presents some concepts of the present disclosure in a general form as a prelude to the more detailed description provided below.

In one example, a semiconductor device is provided. The semiconductor device includes a substrate, a conductive pattern, a first conductive layer, and a dielectric layer. The conductive pattern extends upwardly from the substrate. The conductive pattern has a hollow structure. The first conductive layer covers the conductive pattern. The dielectric layer at least covers the first conductive layer.

In another example, a method for fabricating a semiconductor device is provided. The method includes the actions of: providing a conductive pattern extending upwardly from a substrate, the conductive pattern having a hollow structure; forming a first conductive layer covering the conductive pattern; and forming a dielectric layer at least covering the first conductive layer.

The details of one or more examples are set forth in the accompanying drawings and description below.

BRIEF DESCRIPTION OF THE DRAWINGS

The accompanying drawings illustrate one or more implementations of the present disclosure and, together with the written description, explain the principles of the present disclosure. Wherever possible, the same reference numbers are used throughout the drawings referring to the same or like elements of an implementation.

DETAILED DESCRIPTION

Figure 1:
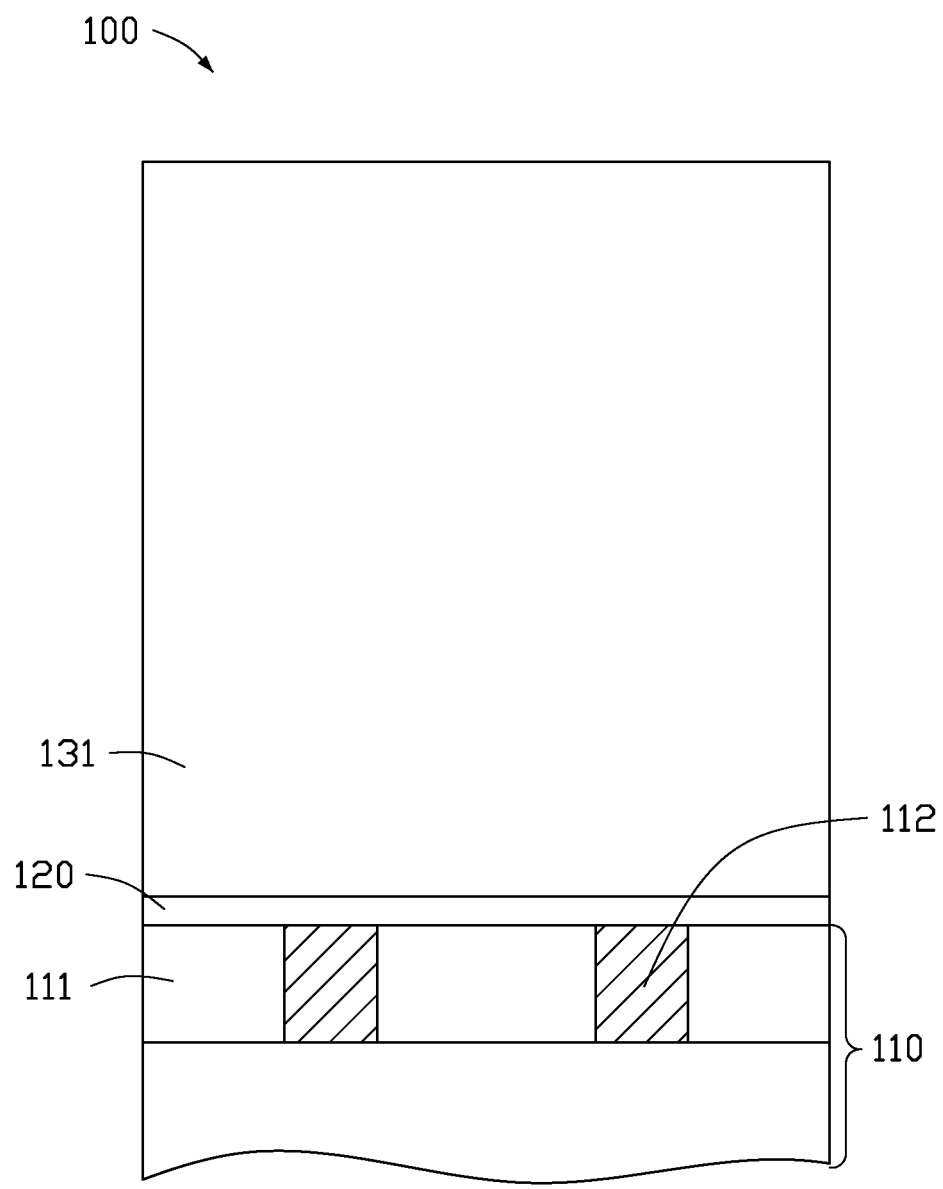
FIGS. 1 to 4 are cross-sectional views of a semiconductor device illustrating a method for fabricating a conductive pattern protruding from the semiconductor device in accordance with various implementations of the present disclosure.

To facilitate an understanding of the principles and features of the various implementations of the present disclosure, various illustrative implementations are explained below. Although example implementations of the present disclosure are explained in detail, it is to be understood that other implementations are contemplated. Accordingly, it is not intended that the present disclosure is limited in its scope to the details of construction and arrangement of components set forth in the following description or illustrated in the drawings. The present disclosure is capable of other implementations and of being practiced or carried out in various ways.

FIGS. 1 to 4 are cross-sectional views illustrating a method for fabricating a conductive pattern protruding from a semiconductor device 100 in accordance with some implementations of the present disclosure. As shown in FIG. 1, the semiconductor device 100 includes a substrate 110, an etch stop layer 120 formed on the substrate 110 and a sacrificial layer 131 formed on the etch stop layer 120. The semiconductor device 100 may be a dynamic random access memory (DRAM) device. The substrate 110 includes a dielectric region 111 and a contact region 112. The dielectric region 111 may be formed of a dielectric material, such as silicon nitride (SiN). The contact region 112 may be formed of a metal material, such as tungsten, titanium, or tantalum. In some implementations, the substrate 110 may be a silicon wafer.

In some implementations, the etch stop layer 120 may include a material selected from SiN, silicon boron nitride (SiBN), silicon carbon nitride (SiCN), silicon carbide (SiC), silicon oxynitride (SiON), silicon oxycarbide (SiOC), or the like. The sacrificial layer 131 may be formed of a silicon oxide-based material, such as silicon oxide (SiOx), plasma enhanced oxide (PEOX), borosilicate glass (BSG), phosphosilicate glass (PSG), boro phospho silicate glass (BPSG), tetraethyl orthosilicate (TEOS), boro tetraethyl orthosilicate (BTEOS), phosphorous tetraethyl orthosilicate (PTEOS), or boro phospho tetraethyl orthosilicate (BPTEOS).

Figure 2:
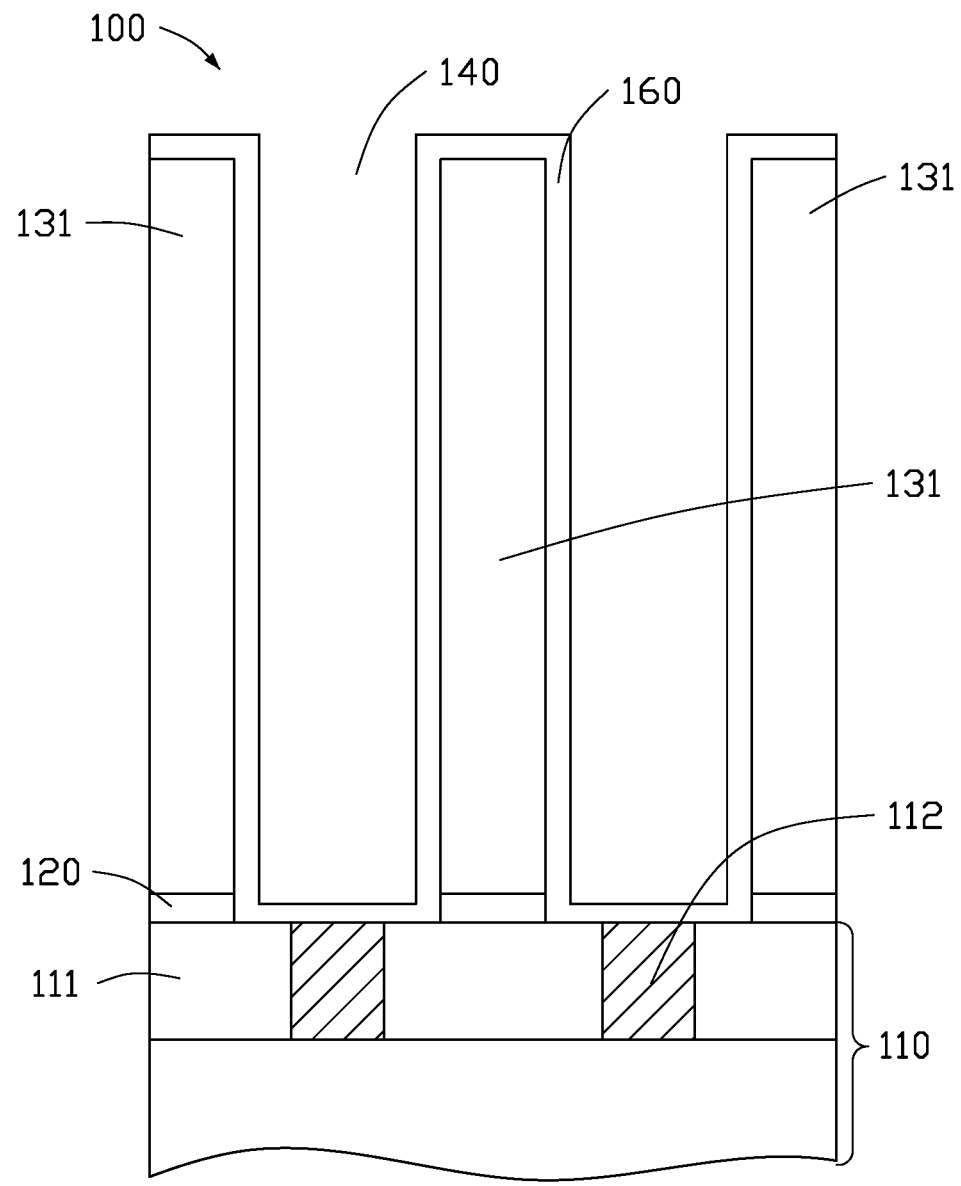

As shown in FIG. 2, an etching process is performed to form a hole 140 penetrating the sacrificial layer 131 and the etch stop layer 120 to expose the substrate 110. For example, a dry etching process such as a plasma etching process, an inductively coupled plasma (ICP) process, a transformer coupled plasma (TCP) process or a reactive ion etching (RIE) process may be used. Subsequently, a conductive pattern 160 is formed on the sacrificial layer 131 by a deposition process such as an atomic layer deposition (ALD) process, a plasma assisted atomic layer deposition (PAALD), a CVD process, a plasma enhanced chemical vapor deposition (PECVD) process, a low pressure chemical vapor deposition (LPCVD) process, a high density plasma chemical vapor deposition (HDP-CVD) process, a spin coating process, a sputtering process, or the like. The conductive pattern 160 covers the surface of the hole 140 and the top of the sacrificial layer 131. The conductive pattern 160 may be formed of a metal including a material such as titanium nitride (TiN), titanium silicide nitride (TiSiN), tungsten nitride (WN), or a compound including a material selected from the group consisting essentially of titanium (Ti), tungsten (W), oxygen (O), nitrogen (N), and silicon (Si). Preferably, the conductive pattern 160 is electrically connected to the contact region 112.

Figure 3:
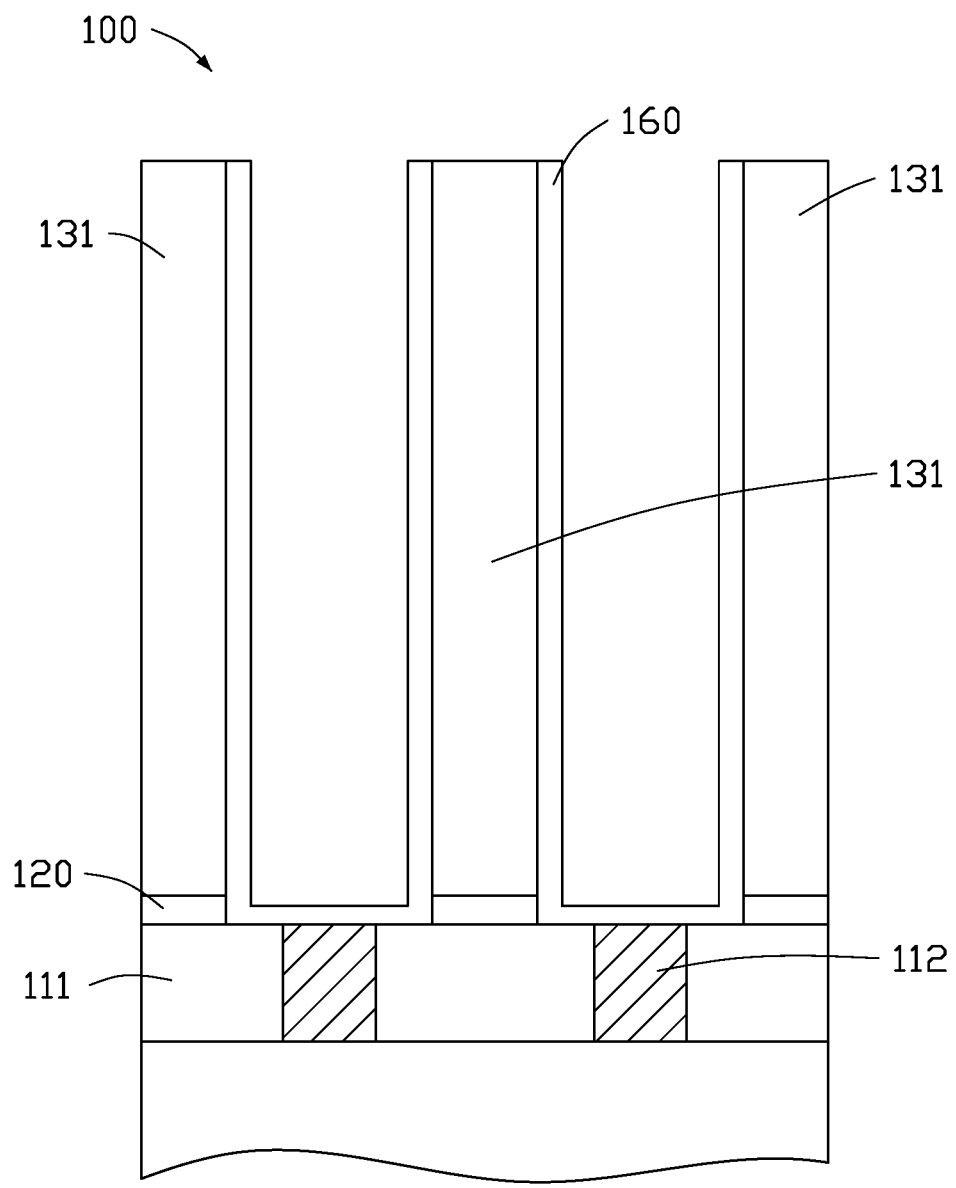
Figure 4:
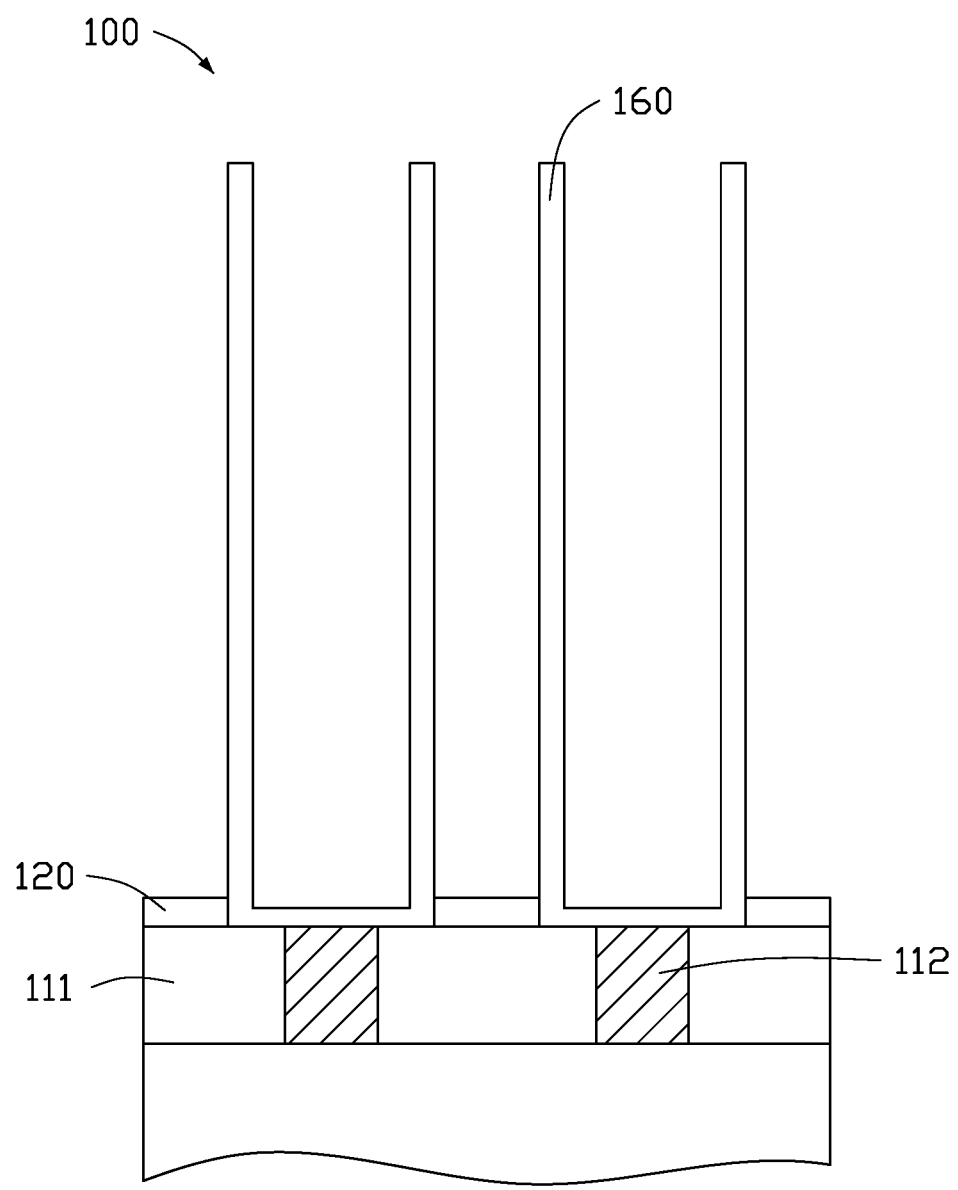

As shown in FIG. 3, a portion of the conductive pattern 160 is removed by a planarization process such as a etchback process or a chemical mechanical polishing (CMP) process. Subsequent to the removal, a top surface of the sacrificial layer 131 is exposed. As shown in FIG. 4, a wet etch process is used to remove the sacrificial layer 131.

Figure 5:
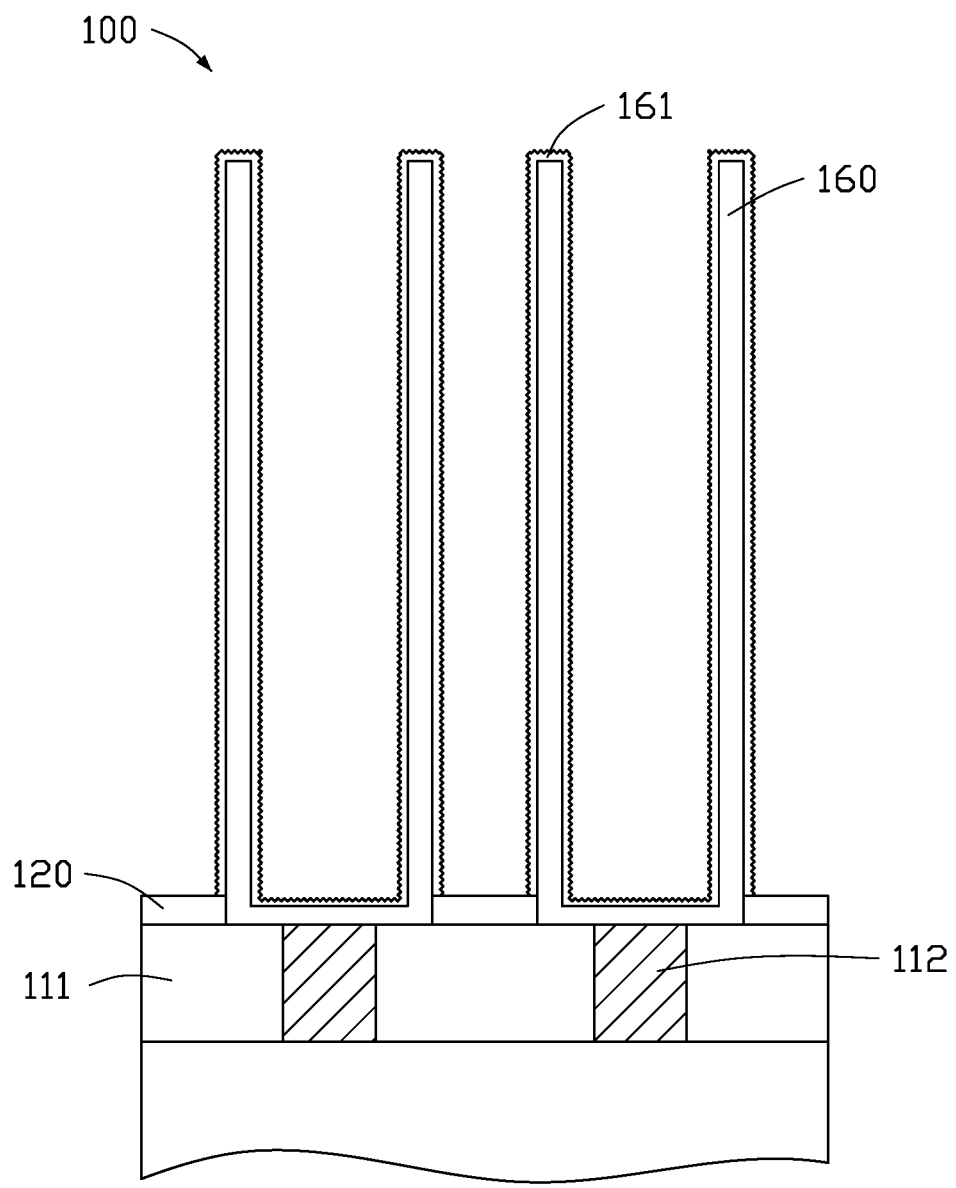
FIGS. 5 to 6 are cross-sectional views of a semiconductor device illustrating a method for fabricating a capacitor having a lower electrode with a multiple-layers structure in the semiconductor device in accordance with various implementations of the present disclosure.
Figure 6:
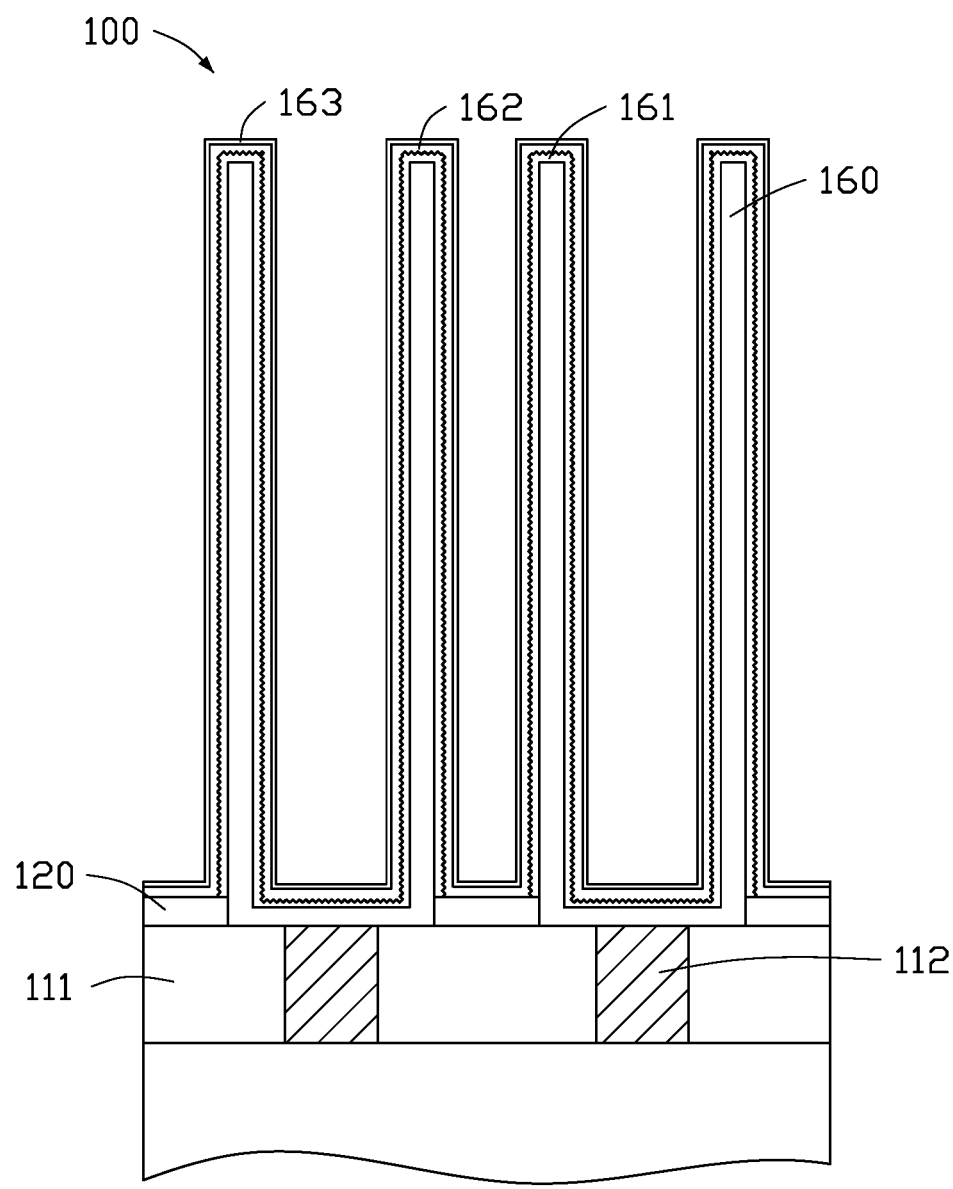

FIGS. 5 to 6 are cross-sectional views illustrating a method for fabricating a capacitor having a lower electrode with a multiple-layers structure in the semiconductor device 100 in accordance with some implementations of the present disclosure. As shown in FIG. 5, a first conductive layer 161 is formed to cover the conductive pattern 160 by a deposition process such as atomic layer deposition (ALD), chemical vapor deposition (CVD), or a sequential flow deposition (SFD). For example, the first conductive layer 161 is selectively deposited on an exposed surface of the conductive pattern 160. In some implementations, the conductive pattern 160 has a hollow cylindrical structure extending vertically from the substrate 110. The first conductive layer 161 covers surfaces of the hollow cylindrical structure including the bottom area, the inner sidewall, the top area, and the outer sidewall. In some examples, the first conductive layer 161 may contact with the etch stop layer 120. Preferably, the first conductive layer 161 includes W, WN, tungsten-containing material, or nitrogen-containing material.

As shown in FIG. 6, a dielectric layer 162 is formed to cover the first conductive layer 161, and the etch stop layer 120. Subsequently, a second conductive layer 163 is formed to cover the dielectric layer 162. For example, the second conductive layer 163 conformally covers the dielectric layer 162. Preferably, the dielectric layer 162 includes $Zr_xO_y$, $Hf_xO_y$, $Ta_xO_y$, $ZrHfSiO_x$, $Ti_xO_y$, $La_xO_y$, $Al_xO_y$, $Hf_xSi_yO_z$, or $Zr_xSi_yO_z$. The second conductive layer 163 may be formed of a metal including a material such as TiN, TiSiN, WN, or a compound including a material selected from the group consisting essentially of Ti, W, O, N, and Si.

In some implementations, a thickness of the conductive pattern 160 is 150 angstrom (Å) or less, and a thickness of the first conductive layer 161 is 50 Å or less. A combination of the conductive pattern 160 and the first conductive layer 161 serves as a lower electrode for a capacitor in DRAM. A root mean square (RMS) of the lower electrode is up to 20 nanometer (nm). A resistivity of the lower electrode is up to 150 microohm centimeter ($\mu\Omega\cdot cm$).

The terminology used herein is for the purpose of describing particular implementations only and is not intended to be limiting of implementations of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, actions, operations, elements, and/or components, but do not preclude the presence or addition of one or more other features, integers, actions, operations, elements, components, and/or groups thereof.

The corresponding structures, materials, acts, and equivalents of all means or action plus function elements in the claims below are intended to include any structure, material, or act for performing the function in combination with other claimed elements as specifically claimed. The description of the present disclosure has been presented for purposes of illustration and description, but is not intended to be exhaustive or limited to implementations of the present disclosure in the form disclosed. Many modifications and variations will be apparent to those of ordinary skill in the art without departing from the scope and spirit of implementations of the present disclosure. The implementation was chosen and described in order to best explain the principles of implementations of the present disclosure and the practical application, and to enable others of ordinary skill in the art to understand implementations of the present disclosure for various implementations with various modifications as are suited to the particular use contemplated.

Although specific implementations have been illustrated and described herein, those of ordinary skill in the art appreciate that any arrangement which is calculated to achieve the same purpose may be substituted for the specific implementations shown and that implementations of the present disclosure have other applications in other environments. This present disclosure is intended to cover any adaptations or variations of the present disclosure. The following claims are in no way intended to limit the scope of implementations of the present disclosure to the specific implementations described herein.

Various examples have been described. These and other examples are within the scope of the following claims.

What is claimed is:

1. A semiconductor device, comprising:
a substrate;
a conductive pattern extending upwardly from the substrate, the conductive pattern having a hollow structure and comprising an inner sidewall and an outer sidewall opposite to the inner sidewall;
a first conductive layer covering the conductive pattern;
a dielectric layer at least covering the first conductive layer; and
a second conductive layer covering the dielectric layer;
wherein the first conductive layer, the dielectric layer, and the second conductive layer conformally cover both the inner sidewall and the outer sidewall of the conductive pattern;
wherein the conductive pattern comprises a compound comprising Ti, W, O, N, and Si;
wherein a thickness of the conductive pattern is 150 angstrom (Å) or less, and a thickness of the first conductive layer is below 50 Å or less.

2. The semiconductor device of claim 1, wherein the conductive pattern is electrically connected to a contact region of the substrate.

3. The semiconductor device of claim 1, further comprising an etch stop layer formed on the substrate, the etch stop layer contacting the conductive pattern, wherein the dielectric layer further covers the etch stop layer.

4. The semiconductor device of claim 3, wherein the etch stop layer comprises a material selected from a group consisting of silicon nitride (SiN), silicon boron nitride (SiBN), silicon carbon nitride (SiCN), silicon carbide (SiC), silicon oxynitride (SiON), and silicon oxycarbide (SiOC).

5. The semiconductor device of claim 1, wherein the second conductive layer comprises titanium nitride (TiN), titanium silicide nitride (TiSiN), tungsten nitride (WN), or a compound comprising a material selected from the group consisting essentially of titanium (Ti), tungsten (W), oxygen (O), nitrogen (N), and silicon (Si).

6. The semiconductor device of claim 1, wherein the first conductive layer comprises W, WN, tungsten-containing material, or nitrogen-containing material.

7. The semiconductor device of claim 1, wherein the dielectric layer comprises $Zr_xO_y$, $Hf_xO_y$, $Ta_xO_y$, $ZrHfSiO_x$, $Ti_xO_y$, $La_xO_y$, $Al_xO_y$, $Hf_xSi_yO_z$, or $Zr_xSi_yO_z$.

8. The semiconductor device of claim 1, wherein a combination of the conductive pattern and the first conductive layer serves as a lower electrode for a capacitor in dynamic random access memory (DRAM), and a root mean square (RMS) roughness of the lower electrode is up to 20 nanometer (nm).

9. The semiconductor device of claim 1, wherein the first conductive layer also covers a top surface and an inner bottom surface of the conductive pattern.

10. A method for fabricating a semiconductor device, comprising actions of:
    providing a conductive pattern extending upwardly from a substrate, the conductive pattern having a hollow structure and comprising an inner sidewall and an outer sidewall opposite to the inner sidewall;
    forming a first conductive layer covering the conductive pattern;
    forming a dielectric layer at least covering the first conductive layer; and
    forming a second conductive layer covering the dielectric layer;
    wherein the first conductive layer, the dielectric layer, and the second conductive layer conformally cover both the inner sidewall and the outer sidewall of the conductive pattern;
    wherein the conductive pattern comprises a compound comprising Ti, W, O, N, and Si;
    wherein a thickness of the conductive pattern is 150 angstrom (Å) or less, and a thickness of the first conductive layer is below 50 Å or less.

11. The method of claim 10, wherein providing the conductive pattern comprises:
    forming an etch stop layer on the substrate;
    forming a sacrifice layer on the etch stop layer;
    forming a hole penetrating the sacrifice layer and the etch stop layer;
    forming the conductive pattern in the hole; and
    removing the sacrifice layer by a wet etch process.

12. The method of claim 11, wherein forming the conductive pattern comprises:
    performing a deposition process comprising atomic layer deposition (ALD), chemical vapor deposition (CVD), or a sequential flow deposition (SFD) to form an electrode layer; and performing a planarization process comprising etch-back or chemical mechanical polishing (CMP) to remove a portion of the electrode layer and expose a top surface of the sacrifice layer.

13. The method of claim 11, wherein the dielectric layer further covers the etch stop layer.

14. The method of claim 10, wherein forming the first conductive layer comprises depositing the first conductive layer on a top surface and an inner bottom surface of the conductive pattern.

15. The method of claim 10, wherein the conductive pattern is electrically connected to a contact region of the substrate.

16. The method of claim 10, wherein a combination of the conductive pattern and the first conductive layer serves as a lower electrode for a capacitor in DRAM, and a resistivity of the lower electrode is up to 150 $\mu\Omega\cdot cm$.

* * * * *